(12) United States Patent
Zhao et al.

(10) Patent No.: US 8,581,381 B2
(45) Date of Patent: Nov. 12, 2013

(54) INTEGRATED CIRCUIT (IC) PACKAGE STACKING AND IC PACKAGES FORMED BY SAME

(75) Inventors: Sam Ziqun Zhao, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/589,120

(22) Filed: Oct. 30, 2006

(65) Prior Publication Data
US 2007/0290376 A1 Dec. 20, 2007

Related U.S. Application Data

(60) Provisional application No. 60/814,875, filed on Jun. 20, 2006.

(51) Int. Cl.
*H01L 23/02* (2006.01)
*H01L 23/28* (2006.01)

(52) U.S. Cl.
USPC .......... 257/686; 257/673; 257/773; 257/777; 257/778; 257/E21.499; 257/E21.502; 438/107; 438/109

(58) Field of Classification Search
USPC ............... 257/686, 777, 778, 787, 673, 773, 257/E21.107, E21.109; 438/107, 109
See application file for complete search history.

(56) References Cited

U.S. PATENT DOCUMENTS

| 4,480,262 | A | 10/1984 | Butt |
| 4,560,826 | A | 12/1985 | Burns et al. |
| 4,680,613 | A | 7/1987 | Daniels et al. |
| 4,803,544 | A | 2/1989 | Holzschuh et al. |
| 5,105,260 | A | 4/1992 | Butera |
| 5,153,379 | A | 10/1992 | Guzuk et al. |
| 5,294,826 | A | 3/1994 | Marcantonio et al. |
| 5,350,943 | A | 9/1994 | Angerstein et al. |

(Continued)

FOREIGN PATENT DOCUMENTS

| CN | 1753178 A | 9/2004 |
| JP | 11-074311 A | 3/1999 |
| TW | 200423322 | 11/2004 |

OTHER PUBLICATIONS

Search Report, dated Jun. 21, 2007, for European Application No. 06 02 4645, 2 pgs.

(Continued)

*Primary Examiner* — Dao H Nguyen
(74) *Attorney, Agent, or Firm* — Sterne, Kessler, Goldstein & Fox P.L.L.C.

(57) ABSTRACT

Methods, systems, and apparatuses for integrated circuit (IC) package vertical interconnection are described herein. In an aspect of the invention, an IC package includes an IC die with contact pads. The IC package also includes interconnect members which are coupled to the die at the contact pads. An encapsulating material encapsulates the IC die and the interconnect members such that a contact surface of each interconnect member is accessible at a surface of the encapsulating material. A second IC package is coupled to the first IC package through the plurality of interconnect members of the first IC package. In an example, solder balls attached to a bottom of the second IC package are coupled to the contact surfaces of the interconnect members to couple the first IC package and the second IC package.

23 Claims, 18 Drawing Sheets

(56) References Cited

U.S. PATENT DOCUMENTS

| | | | |
|---|---|---|---|
| 5,376,756 A | 12/1994 | Kwon | |
| 5,389,816 A | 2/1995 | Shimizu et al. | |
| 5,468,910 A | 11/1995 | Knapp et al. | |
| 5,486,720 A | 1/1996 | Kierse | |
| 5,497,032 A | 3/1996 | Tsuji et al. | |
| 5,559,306 A | 9/1996 | Mahulikar | |
| 5,608,265 A | 3/1997 | Kitano et al. | |
| 5,642,261 A | 6/1997 | Bond et al. | |
| 5,650,659 A | 7/1997 | Mostafazadeh et al. | |
| 5,668,406 A | 9/1997 | Egawa | |
| 5,889,316 A | 3/1999 | Strobel et al. | |
| 5,977,626 A | 11/1999 | Wang et al. | |
| 5,977,636 A | 11/1999 | Sharan | |
| 5,986,340 A | 11/1999 | Mostafazadeh et al. | |
| 6,011,303 A | 1/2000 | Tanaka et al. | |
| 6,092,281 A | 7/2000 | Glenn | |
| 6,229,702 B1 | 5/2001 | Tao et al. | |
| 6,303,997 B1 | 10/2001 | Lee | |
| 6,395,582 B1 | 5/2002 | Sohn et al. | |
| 6,432,742 B1 | 8/2002 | Guan et al. | |
| 6,501,184 B1 | 12/2002 | Shin et al. | |
| 6,528,876 B2 | 3/2003 | Huang | |
| 6,548,911 B2 | 4/2003 | Yu et al. | |
| 6,552,428 B1 | 4/2003 | Huang et al. | |
| 6,614,102 B1 | 9/2003 | Hoffman et al. | |
| 6,617,200 B2 | 9/2003 | Sone | |
| 6,653,723 B2 | 11/2003 | Manansala | |
| 6,707,140 B1 * | 3/2004 | Nguyen et al. | 257/686 |
| 6,717,245 B1 | 4/2004 | Kinsman et al. | |
| 6,737,750 B1 | 5/2004 | Hoffman et al. | |
| 6,765,287 B1 | 7/2004 | Lin | |
| 6,775,140 B2 | 8/2004 | Shim et al. | |
| 6,825,108 B2 | 11/2004 | Khan et al. | |
| 6,838,761 B2 | 1/2005 | Karnezos | |
| 6,848,912 B2 | 2/2005 | Zhang | |
| 6,853,070 B2 | 2/2005 | Khan et al. | |
| 6,861,750 B2 | 3/2005 | Zhao et al. | |
| 6,876,553 B2 | 4/2005 | Zhao et al. | |
| 6,879,039 B2 | 4/2005 | Khan et al. | |
| 6,882,042 B2 | 4/2005 | Zhao et al. | |
| 6,887,741 B2 | 5/2005 | Zhao et al. | |
| 6,906,414 B2 | 6/2005 | Zhao et al. | |
| 6,919,630 B2 | 7/2005 | Hsiao | |
| 6,933,175 B2 | 8/2005 | Lo et al. | |
| 6,989,593 B2 | 1/2006 | Khan et al. | |
| 7,005,737 B2 | 2/2006 | Zhao et al. | |
| 7,015,072 B2 | 3/2006 | Combs et al. | |
| 7,026,709 B2 * | 4/2006 | Tsai et al. | 257/686 |
| 7,026,711 B2 | 4/2006 | Lee et al. | |
| 7,038,312 B2 | 5/2006 | Khan et al. | |
| 7,038,315 B2 | 5/2006 | King et al. | |
| 7,057,277 B2 | 6/2006 | Chen et al. | |
| 7,061,102 B2 | 6/2006 | Eghan et al. | |
| 7,067,911 B1 | 6/2006 | Lin et al. | |
| 7,078,806 B2 | 7/2006 | Khan et al. | |
| 7,094,060 B2 | 8/2006 | Zhang | |
| 7,102,225 B2 | 9/2006 | Khan et al. | |
| 7,132,744 B2 | 11/2006 | Zhao et al. | |
| 7,148,084 B2 | 12/2006 | Strobel et al. | |
| 7,161,239 B2 | 1/2007 | Zhao et al. | |
| 7,168,957 B2 | 1/2007 | Zhang | |
| 7,196,415 B2 | 3/2007 | Zhong et al. | |
| 7,198,987 B1 | 4/2007 | Warren et al. | |
| 7,202,559 B2 | 4/2007 | Zhao et al. | |
| 7,227,256 B2 | 6/2007 | Zhao et al. | |
| 7,241,645 B2 | 7/2007 | Zhao et al. | |
| 7,245,008 B2 | 7/2007 | Lee | |
| 7,245,500 B2 | 7/2007 | Khan et al. | |
| 7,259,445 B2 | 8/2007 | Lau et al. | |
| 7,259,448 B2 | 8/2007 | Zhang et al. | |
| 7,259,457 B2 | 8/2007 | Zhang et al. | |
| 7,262,080 B2 | 8/2007 | Go et al. | |
| 7,262,082 B1 | 8/2007 | Lin et al. | |
| 7,271,024 B2 | 9/2007 | Huang et al. | |
| 7,271,479 B2 | 9/2007 | Zhao et al. | |
| 7,276,802 B2 * | 10/2007 | Hall et al. | 257/780 |
| 7,288,835 B2 | 10/2007 | Yim et al. | |
| 7,312,108 B2 | 12/2007 | Zhao et al. | |
| 7,326,061 B2 | 2/2008 | Zhang | |
| 7,354,800 B2 | 4/2008 | Carson | |
| 7,372,151 B1 | 5/2008 | Fan et al. | |
| 7,385,299 B2 * | 6/2008 | Chow et al. | 257/787 |
| 7,402,906 B2 | 7/2008 | Rahman Khan et al. | |
| 7,411,281 B2 | 8/2008 | Zhang | |
| 7,432,586 B2 | 10/2008 | Zhao et al. | |
| 7,435,619 B2 * | 10/2008 | Shim et al. | 438/107 |
| 2001/0042913 A1 | 11/2001 | Fukuda et al. | |
| 2002/0024137 A1 | 2/2002 | Olofsson et al. | |
| 2002/0079572 A1 | 6/2002 | Khan et al. | |
| 2002/0100976 A1 * | 8/2002 | Hui et al. | 257/738 |
| 2002/0190361 A1 | 12/2002 | Zhao et al. | |
| 2002/0190396 A1 | 12/2002 | Brand | |
| 2003/0057550 A1 | 3/2003 | Zhao et al. | |
| 2003/0111728 A1 | 6/2003 | Thai et al. | |
| 2003/0146509 A1 | 8/2003 | Zhao et al. | |
| 2003/0178719 A1 | 9/2003 | Combs et al. | |
| 2004/0038447 A1 | 2/2004 | Corisis et al. | |
| 2004/0052060 A1 | 3/2004 | Cady et al. | |
| 2004/0084771 A1 | 5/2004 | Bolken et al. | |
| 2004/0145039 A1 | 7/2004 | Shim et al. | |
| 2004/0178499 A1 * | 9/2004 | Mistry et al. | 257/734 |
| 2004/0183174 A1 | 9/2004 | Huang et al. | |
| 2005/0023657 A1 | 2/2005 | Tsai et al. | |
| 2005/0029657 A1 | 2/2005 | Khan et al. | |
| 2005/0035452 A1 | 2/2005 | Zhang et al. | |
| 2005/0046006 A1 | 3/2005 | Yeom | |
| 2005/0077545 A1 | 4/2005 | Zhao et al. | |
| 2005/0127501 A1 | 6/2005 | Khan et al. | |
| 2005/0280127 A1 | 12/2005 | Zhao et al. | |
| 2005/0280139 A1 | 12/2005 | Zhao et al. | |
| 2005/0280141 A1 | 12/2005 | Zhang | |
| 2006/0006534 A1 | 1/2006 | Yean et al. | |
| 2006/0012037 A1 | 1/2006 | Raedt et al. | |
| 2006/0065972 A1 | 3/2006 | Khan et al. | |
| 2006/0091542 A1 | 5/2006 | Zhao et al. | |
| 2006/0166397 A1 | 7/2006 | Lau et al. | |
| 2007/0007644 A1 | 1/2007 | Zhao et al. | |
| 2007/0040267 A1 | 2/2007 | Zhao et al. | |
| 2007/0045824 A1 | 3/2007 | Zhao et al. | |
| 2007/0090502 A1 | 4/2007 | Zhao et al. | |
| 2007/0108598 A1 | 5/2007 | Zhong et al. | |
| 2007/0158806 A1 | 7/2007 | Kwon et al. | |
| 2007/0158809 A1 * | 7/2007 | Chow et al. | 257/686 |
| 2007/0200210 A1 | 8/2007 | Zhao et al. | |
| 2007/0210432 A1 * | 9/2007 | Cablao et al. | 257/686 |
| 2007/0267734 A1 | 11/2007 | Zhao et al. | |
| 2007/0267740 A1 | 11/2007 | Zhao et al. | |
| 2007/0273023 A1 | 11/2007 | Zhao et al. | |
| 2007/0273049 A1 | 11/2007 | Khan et al. | |
| 2007/0278632 A1 | 12/2007 | Zhao et al. | |
| 2007/0290322 A1 | 12/2007 | Zhao et al. | |
| 2007/0290376 A1 | 12/2007 | Zhao et al. | |
| 2008/0006934 A1 | 1/2008 | Zhao et al. | |
| 2008/0096312 A1 | 4/2008 | Law et al. | |
| 2008/0105973 A1 | 5/2008 | Zhang | |
| 2008/0182364 A1 | 7/2008 | Zhang | |
| 2008/0211089 A1 | 9/2008 | Khan et al. | |

OTHER PUBLICATIONS

Dreiza et al., "Implement stacked package-on-package designs", Amkor Technology Inc., retrieved from the internet on Oct. 17, 2005 http://www.eetasia.com/ARTICLES/2005OCT/B/2005OCT17_EDA_MFG_TA.pdf., pp. 1-3.

Babinetz, Stephen, "Wire Bonding Solutions for 3-D Stacked Die Packages", Kulicke & Soffa Industries, as published in Electronics Manufacturing Engineering, Q3, 2003, pp. 1-10.

Carson et al. "Advances in Stacked-Die Packaging", ChipPAC Inc., 2002, pp. 7-13.

"TAPP™ Thin Array Plastic Package", ASAT Peak Performance, retrieved from the internet on Oct. 27, 2006, http://www.asat.com/products/leadless/tapp.php, pp. 1-5.

(56) References Cited

OTHER PUBLICATIONS

"ASAT's Fine-Pitch Ball Grid Array", ASAT Peak Performance, retrieved from the internet on Oct. 27, 2006, http://www.asat.com/index.php, pp. 1-2.

"Stacked Die", ASAT Peak Performance, retrieved from the internet on Oct. 27, 2006, http://www.asat.com/products/sip/stacked.phP, p. 1.

"PBGA Plastic Ball Grid Array", ASAT Peak Performance, retrieved from the internet on Oct. 27, 2006, http://www.asat.com/products/array/pbga.php, pp. 1-2.

Freyman et al., "Overmolded Plastic Pad Array Carriers (OMPAC): A low Cost, High Interconnect Density IC Packaging Solution for Consumer and Industrial Electronics", Electronic Components and Technology Conference, IEEE, 1991, pp. 176-182.

Harper, Charles A., "Packaging and Interconnection of Integrated Circuits," Electronic Packaging and Interconnection Handbook, 3$^{rd}$ Edition, pp. 7.61-7.67, McGraw-Hill, USA, copyright 2000.

English Abstract of CN 1753178, publication date of Mar. 29, 2006.

John H. Lau, "Ball Grid Array Technology", McGraw-Hill, Inc., 1995.

Office Action as Mailed on Aug. 1, 2008 and cited in U.S. Appl. No. 11/652,007, (filed Jan. 11, 2007).

Office Action as Mailed on Feb. 13, 2009 and cited in U.S. Appl. No. 11/652,007, (filed Jan. 11, 2007).

Office Action as Mailed on May 1, 2009 and cited in U.S. Appl. No. 11/652,007, (filed Jan. 11, 2007).

Search Report for European Application No. EP 07 00 8564 completed on Sep. 10, 2007, 3 pages.

Communication from the European Patent Office issued in European Application No. EP 07 00 8564 on Jan. 31, 2011, 4 pages.

English language Abstract of Japanese Patent Publication No. JP 11-074311 A, Japanese Patent Office, Patent & Utility Model Gazette DB, Patent Abstracts of Japan, (1999).

English abstract for Taiwan Patent Pub. No. 200423322, published Nov. 1, 2004, 1 page.

\* cited by examiner

1100

1130

1140

1150

INTEGRATED CIRCUIT (IC) PACKAGE STACKING AND IC PACKAGES FORMED BY SAME

This application claims the benefit of U.S. Provisional Appl. No. 60/814,875, filed Jun. 20, 2006, which is herein incorporated by reference in its entirety.

BACKGROUND OF THE INVENTION

1. Field of the Invention

The invention relates generally to the field of integrated circuit (IC) device packaging technology, and more particularly to package to package interconnection of IC packages.

2. Background Art

The die-up plastic ball grid array package (PBGA) was first introduced by Motorola and was called an overmolded plastic pad array carriers (OMPAC). See Freyman, and Pennisi, "Overmolded Plastic Pad Array Carriers (OMPAC): A Low Cost, High Interconnect Density IC Packaging Solution for Consumer and Industrial Electronics," Electronic Components and Technology Conference, IEEE, pp. 176-182, (1991), which is incorporated by reference herein in its entirety.

A PBGA package features a plastic printed circuit board (substrate) typically made of BT (Bismaleimide Triazine) resins or FR4 materials. FIG. 1 shows a conventional PBGA package 100. An integrated circuit (IC) die 102 is attached directly to a top surface of a substrate 110 using a die attach material 106. Wirebonds 114 are used to electrically connect the integrated circuit of IC die 102 to the printed circuit of substrate 110. A matrix of solder balls 108 is mounted on the bottom side of substrate 110. Die 102 and wirebonds 114 are protected from the environment by a plastic molding compound 112. Mold compound 112 encapsulates both die 102 and the wirebond 114, and covers a center region of the top surface of the substrate 110. A periphery of the top surface of substrate 110 is left exposed. FIGS. 2A-2B show plan and side views of PBGA package 100.

A conventional PBGA package, such as package 100, has numerous drawbacks, including: (1) a thick top mold (e.g., mold compound 112) and a large overall package profile height; (2) a small ratio of die size to package size due to a mold cap which must be clamped to the package substrate 110 for molding; and (3) a large package body size.

The Joint Electron Device Engineering Council (JEDEC) has a standard for mold thickness standard for PBGA packages, which is 1.17 mm. With a mold thickness of 1.17 mm, the overall height of a typical PBGA package is in the range of 1.5 mm~2.5 mm. However, a thinner package is more desirable for many applications, such as hand-held communication devices (cell phones, global positioning devices, watch-size communication devices, etc.), mobile multimedia (video/audio) players, wireless personal area networking devices such as Bluetooth headsets, and flash memory devices and memory cards.

A mold chase with multiple mold caps (mold cavities) is used for mold encapsulation of the JEDEC standard PBGA packages. PBGA package substrates are typically formed in a strip or panel of substrates. Each individual substrate unit in a substrate strip or panel has a corresponding mold cap of the mold chase for molding. Typically, a thermoset molding epoxy is applied in each mold cap, and the mold chase is applied to the substrate strip. In a finished package, the periphery of the top surface of each substrate is exposed as shown in FIGS. 1, 2A, and 2B (i.e., not covered by molding compound 112). Prior to application of the mold compound, both the IC die and the wirebonds must be placed within a mold cavity. Additionally, the IC die and the wirebonds must be kept far enough away from the inner walls of the mold cavity to allow for mold flow and to avoid wire sweeping. Therefore, the size of the IC die is limited by the size of the mold cap (i.e., the mold cavity). Therefore, for a PBGA package, the maximum size of the die must be substantially smaller than the substrate.

Thus, conventional PBGA packages are typically large in body size, ranging from 19 mm×19 mm and above. Large package sizes are undesirable for mobile applications where bulky electronic components make for bulky devices.

To reduce package size, chip scale packages have been developed where the size of the IC die is very close to the size of package. FIGS. 3A and 3B respectively show a perspective view and a cross-sectional view of a fine pitch ball grid array (FBGA) package 300. Similarly to PBGA package 100 described above, in FBGA package 300, a die 102 is mounted to a substrate 110 by a die attach material 106. IC die 102 is electrically connected by a plurality of wire bonds 114 to conductive features (e.g., traces, bond fingers, etc) such as a trace 210 on a top surface of a substrate 110. Mold compound 112 encapsulates die 102, wirebond 114, and the entire top surface of substrate 110. Solder balls 108 of FBGA package 300 may be smaller than solder balls 108 of PBGA package 100, and a smaller ball pitch may be used to space solder balls of FBGA package 300. In addition to the smaller solder balls 108 and smaller ball pitch, thickness of mold compound 112 is reduced to 0.25 mm~0.7 mm. Molding compound 112 covers the entire top surface of FBGA package 300, enabling an increase in the ratio of the size of die 102 to the size of substrate 110 in FBGA package 300 versus PBGA package 100.

However, while providing some improvement, FBGA packages still suffer from the disadvantages described above with regard to PBGA packages. Thus, what are needed are IC packages that have small size and can accommodate large and complex ICs.

BRIEF SUMMARY OF THE INVENTION

Methods, systems, and apparatuses for integrated circuit (IC) package to package vertical interconnection are described herein. The invention relates to numerous IC package types, including ball grid array (BGA) packages.

In an aspect of the invention, a first IC package is modified to expose a plurality of interconnect contact pads. A BGA package is stacked upon the first IC package. In an aspect, solder balls attached to a bottom surface of the BGA package are coupled to the interconnect members, which are accessible on the top surface of the first IC package.

In an aspect of the invention, an IC package includes an IC die with die contact pads. The IC die is encapsulated in an encapsulating material, such as a mold compound. The IC package also includes interconnect members which are electrically coupled to the die at the die contact pads, to form interconnect contact pads at the external surface of the IC package In an alternative aspect, an IC package includes an IC die mounted to a first surface of a substrate. The IC package also includes interconnect members which are electrically coupled to the first surface of the substrate. The IC die and interconnect members are encapsulated in an encapsulating material. A top portion of the interconnect members is not covered by the encapsulating material to form interconnect contact pads at the external surface of the IC package.

In another aspect of the invention, a cavity is formed in the encapsulating material, in which the interconnect contact pads are exposed.

In an aspect of the invention, a first IC package includes a die, one or more interconnect members, a substrate, an encapsulating material encapsulating the die and interconnect members. The first IC package is electrically coupled to a second IC package through the interconnect members.

In an aspect of the invention, an IC package is manufactured by a method which includes attaching an IC die to a substrate, electrically coupling interconnect members to the die and/or the substrate, electrically connecting the die to the substrate by a wirebonding process, encapsulating the package, and at least partially exposing at least some of the interconnect members.

In one aspect of the invention, the interconnect members are exposed by removing an entire layer of an encapsulating material. In another aspect of the invention, the interconnect members are exposed by forming a cavity in the encapsulating material.

In an aspect of the invention, a package-on-package (PoP) stack is manufactured. An IC die is attached to a first surface of a substrate using a die attach material. Interconnect members are electrically coupled to the die and/or the first surface of the substrate. The die is electrically connected to the substrate using a wire bonding process. In this manner, a first IC package is formed. The first package is encapsulated in an encapsulating material. The interconnect members are at least partially exposed. A second IC package is mounted to the first IC package.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
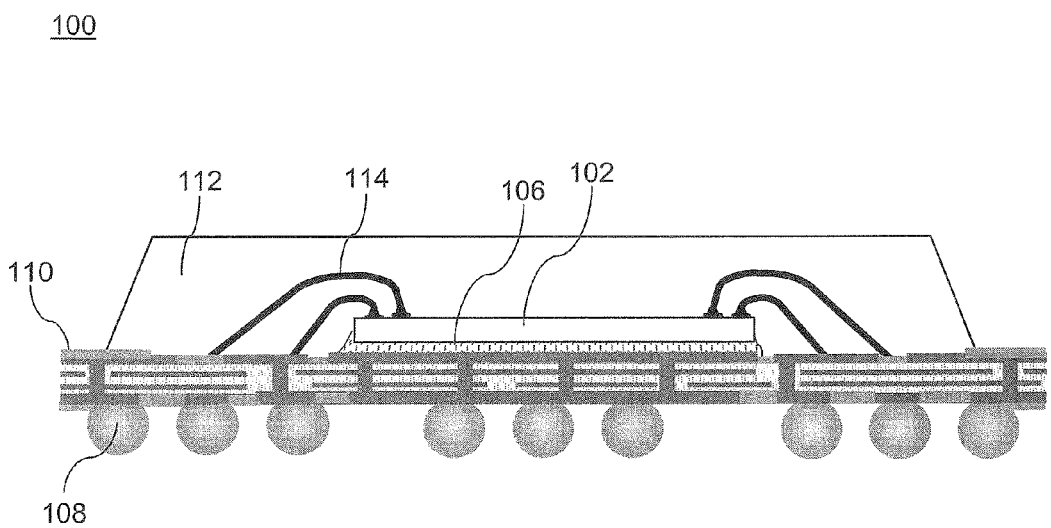
FIG. 1 illustrates a conventional plastic ball grid array (PBGA) integrated circuit (IC) package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

Methods, systems, and apparatuses for IC device packaging technology are described herein. In particular, methods, systems, and apparatuses for package to package interconnection of IC packages to form improved IC packages are described.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

In an embodiment, a package to package interconnect structure provides electrical coupling from a die (or dice) of a first package through an encapsulating material of the first IC package to a second IC package. The interconnect structure provides an interconnect contact pad for the attachment of a solder ball of the second IC package. In an embodiment, an array of interconnect members of the first IC package provide an array of interconnect contact pads for an array of solder balls on the bottom of the second IC package. The array of interconnect members of the first IC package provide a short interconnection path between an IC die (or dice) in the first IC package and electrical terminals of the second IC package. The combination of the first and second IC packages form a third IC package with compact size that accommodates at least two IC dies.

Conventional IC die encapsulation processes such as dam-and-fill (glob top), mold cap injection molding (transfer molding), and strip or panel over-molding (mold compound covers the edges of package substrate) can be used in embodiments of the first and second packages. Embodiments of the invention apply to many existing package technologies, including ball grid array (BGA) packages (e.g., fine pitch BGA (FBGA), plastic BGA (PBGA)), land grid array (LGA) packages, and leadframe packages. Furthermore, different package types may be stacked to form an improved IC package, including the stacking of leadframe packages on BGA packages, the stacking of BGA packages on leadframe packages, and other combinations. Although the detailed description provided herein typically describes first and second packages, persons of ordinary skill in the relevant art(s) would realize that the second package can be the "first package" for another "second package," etc. Thus, in embodiments, a stack may include numbers of stacked IC packages of two or more IC packages.

Conventional IC Packages

Figure 4A:
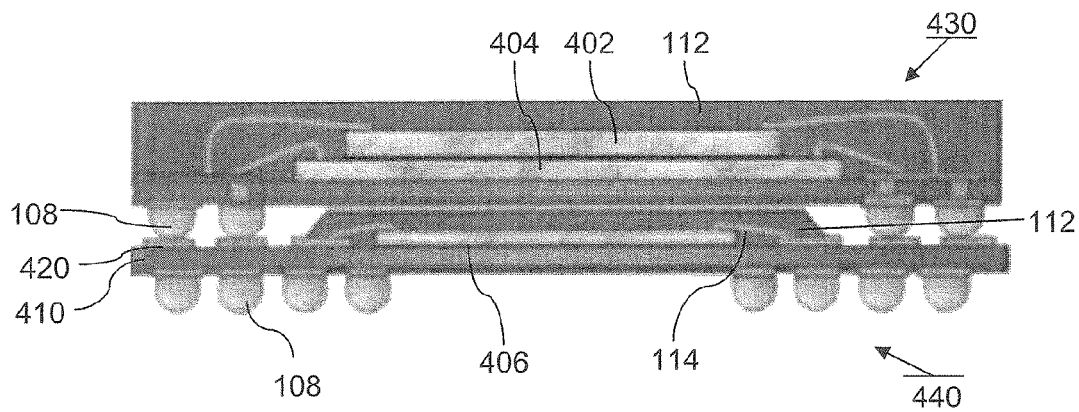
FIGS. 4A-4B illustrate cross-sectional views of conventional package on package (PoP) stacked IC devices.
Figure 4B:
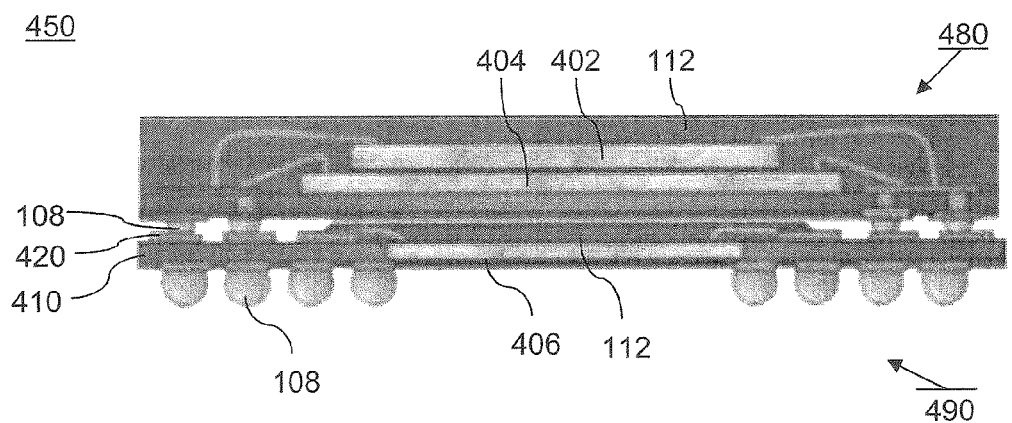

PBGA and FBGA packages are examples of conventional IC packages. Package on package (PoP) stacked IC packages referred to "as package stackable very-thin fine-pitch Ball Grid Array" (PSvfBGA) packages exist. See Dreiza et al, "Implement Stacked Package-on-Package Designs," at http://www.eetasia.com/ARTICLES/2005OCT/B/2005OCT17_EDA_MFG_A.pdf) (hereinafter "Dreiza"), which is incorporated by reference herein in its entirety. FIGS. 4A-4B show examples of stacked PSvfBGA packages. FIG. 4A shows a stacked IC package 400. As shown in FIG. 4A, stacked IC package 400 includes a package-to-package interconnection made by mounting a top BGA package 430 to a substrate 410 of a bottom BGA package 440. Top and bottom BGA packages 430 and 440 are very fine-pitch BGA packages.

Bottom package 440 has exposed land pads 420 on a top surface of substrate 410, that provide contact areas for solder balls 108 on a bottom surface of top BGA package 430. Exposed land pads 420 are located at a periphery of the top surface of substrate 110, surrounding a mold compound 112 formed on the top surface of bottom package 440. Top package 430 can be attached to bottom package 440 using a conventional reflow surface mount process.

FIG. 4B illustrates a stacked IC package 450, that includes a package-to-package interconnection made by mounting a top BGA package 480 to a substrate 410 of a bottom package 490. Top and bottom BGA packages 480 and 490 are very fine-pitch BGA packages. Stacked IC package 450 has reduced overall package stack height because IC die 406 of bottom package 490 is positioned within a window opening through substrate 410 of package 490.

Figure 2A:
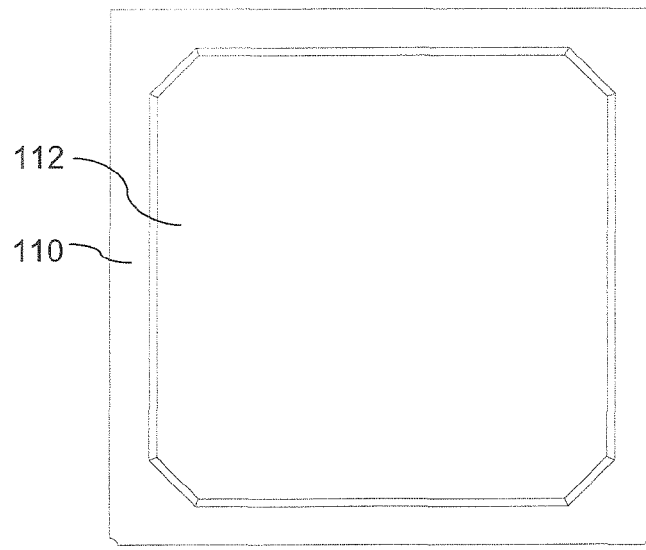
FIGS. 2A-2B illustrate views of the PBGA IC package of FIG. 1.
Figure 2B:
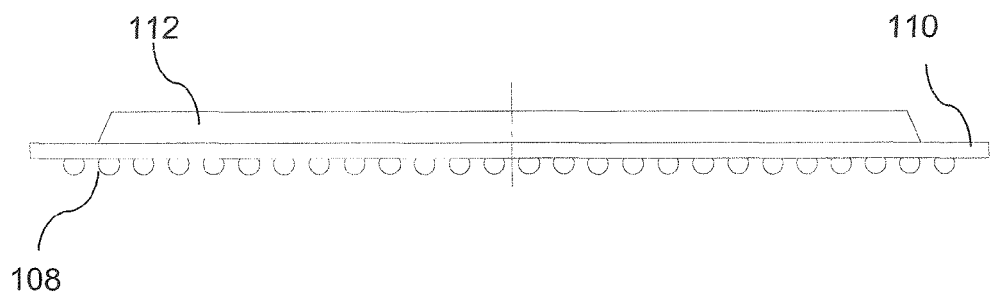
Figure 3A:
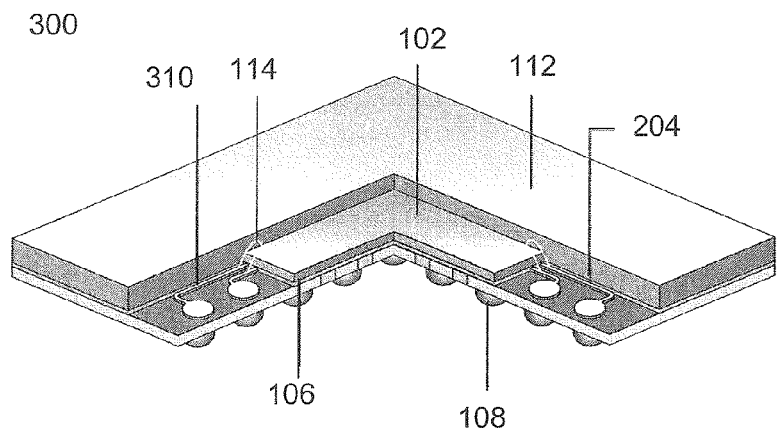
FIGS. 3A-3B illustrate views of a conventional fine pitch ball grid array (FBGA) IC package.
Figure 3B:
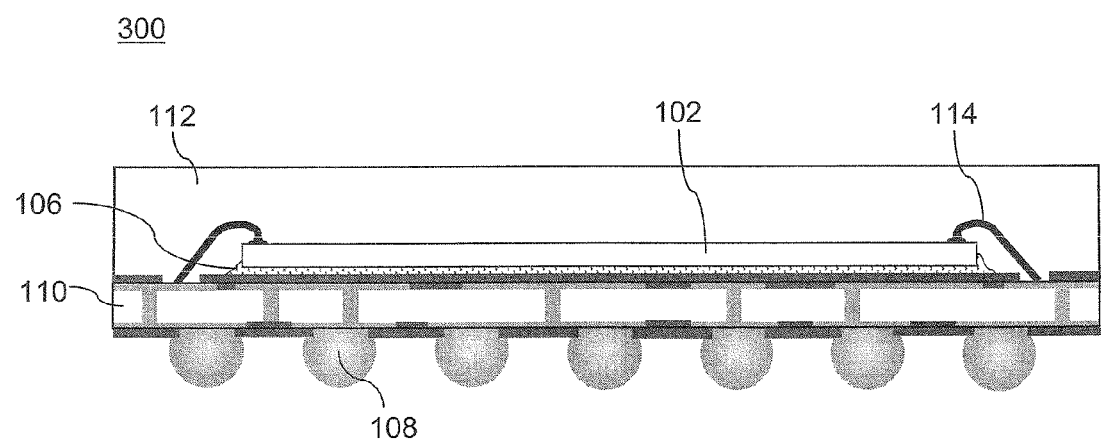

However, a size of die 406 in bottom package 490 is limited in this configuration. As shown in FIG. 4A, the interconnection between top package 430 and bottom package 440 is made at the peripheral region of substrate 410 (outside mold compound 112) of bottom package 440. IC die 406 and wirebond 114 of bottom package 440 must be encapsulated with mold compound 112. Thus, a mold cap must be sized to prevent mold compound 112 from covering or contaminating exposed land pads 420. The mold cap cavity must be smaller than substrate 410. Thus, bottom IC package 440 must be similar to PBGA (as shown in FIGS. 2A-2B), and cannot be an overmold type (e.g., the FBGA package 300 shown in FIGS. 3A-3B) where the periphery of substrate 410 is covered by mold compound 112. Thus, the size of die 406 in bottom package 440 is limited such that both die 406 and wirebond 114 fit within mold compound 112, which must be sized to leave the periphery of substrate 410 exposed.

Moreover, under some circumstances it is advantageous to minimize mechanical stress between the top and bottom packages by using the same size and type of packages (i.e., with exactly the same structure, die or dice sizes, substrate and/or die carrier structure, etc.) for both the bottom and top packages. In such configurations, the top and bottom package is a PBGA package or similar type with a poor die size to substrate size ratio. Thus, what is lacking in conventional stacked IC packages is an interconnection structure that maximizes the die size for a given package body size for the bottom package. Embodiments of the present invention, described in the next section, enable larger die sizes for the bottom package in a stack.

FBGA packages, as described above (e.g., package 300 shown in FIGS. 3A-3B), have a better die to substrate ratio and a thinner mold chase. Thus, stacking FBGA packages may reduce the overall footprint and the overall stack height (or increase the number of packages in a stack for a given height). Therefore, a way to stack FBGA packages is desirable. Embodiments of the present invention, described in the next section, enable stacking of FBGA packages.

Additionally, many applications require high speed and broad bandwidth signaling between IC chips (e.g., 3rd generation wireless communication technologies (3G) integrated with high-speed voice, data, and video functions). A reduced interconnect electrical impedance between stacked packages is needed to support these applications. A more direct die to package interconnection within the PoP stacking structure is thus desirable. Embodiments of the present invention, described in the next section, enable more a direct connection of die-to-package in a stack.

Overmolded area array packages such as FBGA and land grid array (LGA) packages do not have electrical signal interconnect terminals on package top surface. The same problem exists for some types of leadframe packages, such as no-lead quad flat packages (QFN) (also known as micro leadframe packages (MLP, MLF), and plastic leadless chip carrier (PLCC) packages), and thin array plastic packages (TAPP). Consequently, these package types cannot have other packages stacked on their top. Therefore, what is needed is a way to stack overmolded package types. Embodiments of the present invention, described in the next section, enable such stacking.

Example Interconnect Members

In an embodiment, a plurality of interconnect members enable a PoP interconnection, where a second IC package is stacked on a first IC package. An interconnect member may be an electrically conductive ball (e.g., solder ball), block, lump, or other regular or irregular object/material that makes an electrical connection through an encapsulation material of the first IC package.

Interconnect members are represented in the attached figures as spherical in shape, such as solder balls. However, interconnect members are shown in this manner for illustrative purposes, and are not intended to be limited to spheres. Any electrically conductive material in any shape may serve as an interconnect in different embodiments of the invention. For example, interconnect members may alternatively be electrically conductive posts/pins. The posts/pins may be formed before or after application of the encapsulation material. For example, if formed after application of the encapsulation material, holes may be drilled through the encapsulation material, the a metal or other electrically conductive material may be inserted into the holes (in liquid, gas, or solid form) to form the posts/pins. Furthermore, the interconnect members may be balls other than solder balls, such as balls made from a different metal, such as copper, aluminum, gold, nickel, tin, silver, or a combination of metals/alloy.

Furthermore, in an embodiment, the balls may have a core made of a first material that is covered by a shell made from a second material. For example, a core-shell ball may be a core ball made of copper covered by a shell of solder material. In an embodiment, an interconnect member is made of a core material that is coated with a bonding material such as solder, gold, silver, an epoxy, or other joining materials that mechanically bonds the thermal interconnect member with contact pads.

In embodiments, the interconnect members extend through the encapsulation material. In one embodiment, the interconnect members are truncated. For example, a top layer (or a portion of a top layer) of the encapsulation material may be removed from the bottom IC package, removing a top portion of the interconnect members in the process. In this manner, the interconnect members are thus exposed and provide a relatively uniform array of interconnect contact pads on an external surface of the package. These interconnect contact pads may be used for interconnection with a second IC package. In an embodiment, the plurality of interconnect members are mounted to a top surface of an IC die. In another embodiment, the plurality of interconnect members are mounted to a top surface of the package substrate.

Example embodiments of the present invention are described in detail below.

Example Embodiments for Interconnect Contact Pads

Figure 5A:
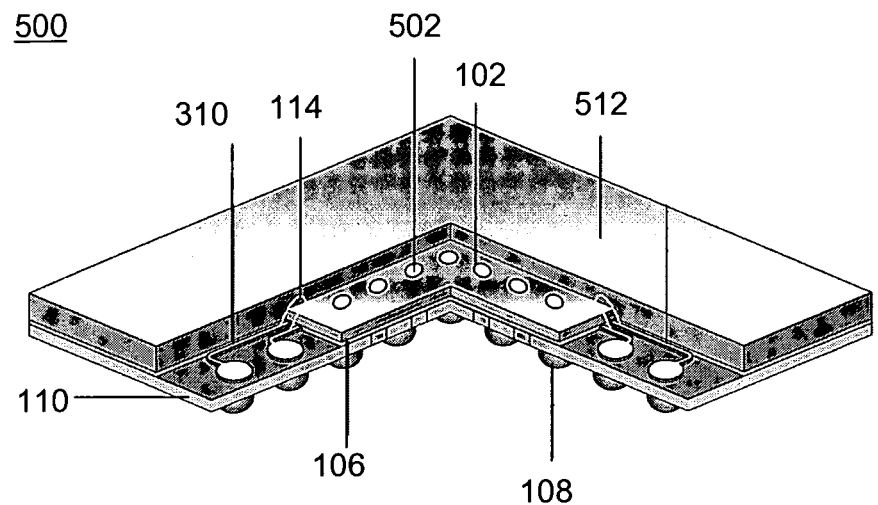
FIGS. 5A-5D illustrate views of example FBGA IC packages having interconnect members, according to exemplary embodiments of the invention.

FIGS. 5A-5D illustrate views of example IC packages, according to embodiments of the present invention. FIG. 5A shows a perspective cutaway view of an FBGA package 500. In package 500, an IC die 102 is electrically connected by a plurality of wire bonds 114 to conductive features (e.g., traces, bond fingers, etc) on a top surface of a substrate 110. The conductive features on the top surface of substrate 110 are electrically coupled through substrate 110 (e.g., through one or more electrically and/or non-electrically conductive layers) to solder ball pads on a bottom surface of substrate 110. Furthermore the top and/or bottom surfaces of substrate 110 may be partially coated with non-electrically conductive material, such as a solder mask material, to insulate selected electrically conductive features on the top and bottom surfaces from short circuiting, etc. Conductive features on the top surface of substrate 114 to which wirebonds 114 connect are not covered with the non-electrically conductive material. Solder balls 108 are coupled to the solder ball pads, and are configured to be coupled to a circuit board, such as a printed circuit board (PCB) or printed wire board (not shown in FIGS. 5A-5D).

Figure 5B:
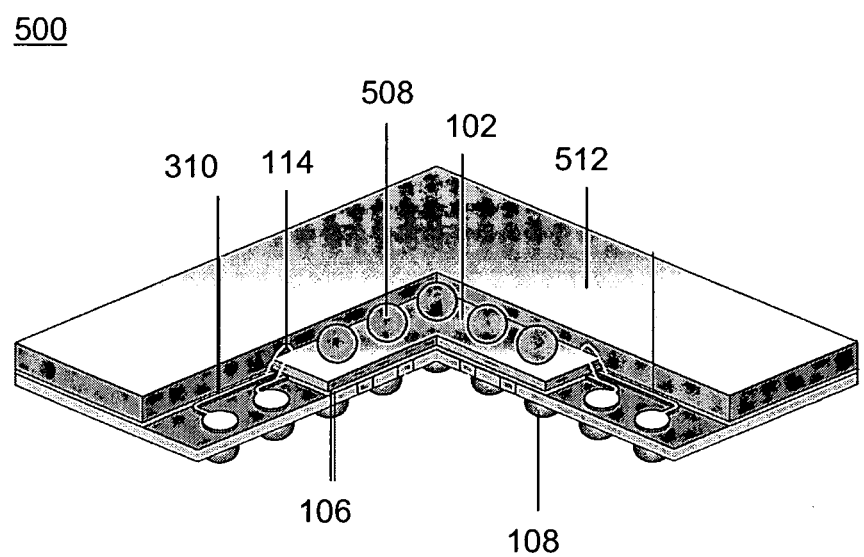
Figure 5C:
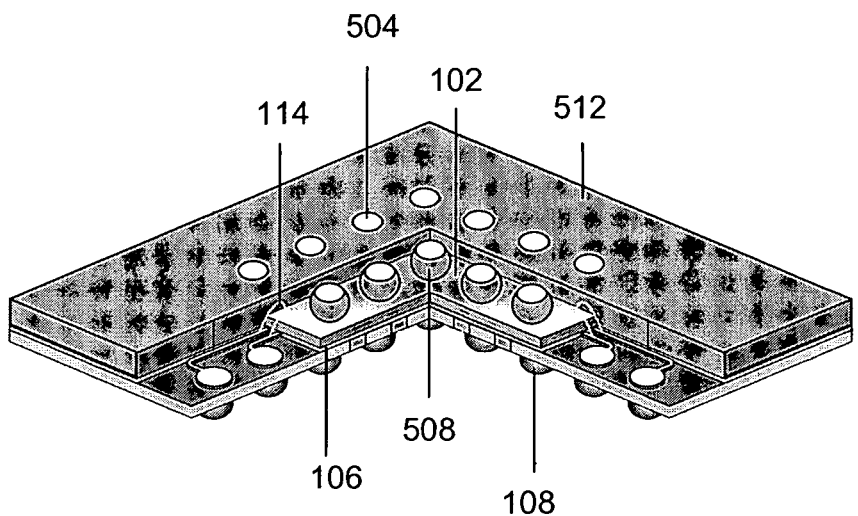
Figure 5D:
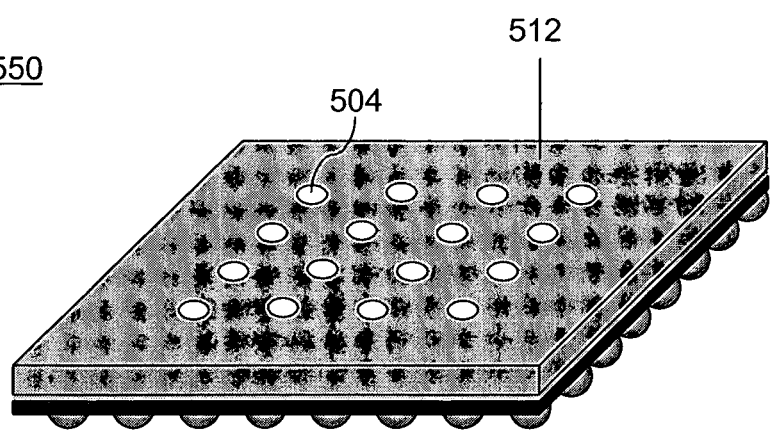

As shown in FIG. 5A, a top surface of die 102 has a plurality of contact pads 502. FIG. 5B shows a perspective cutaway view of an FBGA package 500, with interconnect members 508 visible. In FIG. 5B, interconnect members 508 are attached to corresponding contact pads 502. In embodiments, die 102 can have any number of contact pads 502, each for coupling with an interconnect member 508. Contact pads 502 are electrically coupled to electrical signals of die 102, including input/output signals, power signals, grounds signals, etc. Encapsulating material 512 encapsulates package 500. In the embodiments of FIGS. 5B-5D, interconnect members 508 are completely covered with encapsulating material 512. Encapsulating material 512 can be any type of encapsulating material used in IC packages that is described elsewhere herein, or is otherwise known, including an epoxy, a molding compound, etc.

FIGS. 5C and 5D respectively show a perspective cutaway view and a perspective view of an FBGA package 550. Package 550 is similar to package 500, except that encapsulating material 512 does not encapsulate top surfaces 504 of interconnect members 508. In an embodiment, a top layer of encapsulating material 512 is removed to expose surfaces 504 of interconnect members 508. In such an embodiment, interconnect members 508 are truncated to form the planar exposed surfaces 504 of interconnect members 508, and surfaces 504 are co-planar with a top surface of encapsulating material 512. Surfaces 504 can also be referred to as "electrical contact pads" or "interconnect contact pads." Exposed surfaces 504 on package 550 can be used for electrical connections (e.g., signal, ground, or power) to die 102 for devices external to package 550. Various methods exist to truncate the spheres embedded in a package encapsulating material, including those further described below. FIG. 5D shows the external view of an example completed package 550. Interconnect contact pads 504 are visible on the external surface of encapsulating material 512.

In an embodiment, surfaces 504 exposed on package 550 may be used for a package-to-package electrical interconnection to form a stacked IC package. Many electronic components, including IC packages, inductors, capacitors, resistors, transistors, diodes, etc., can be electrically connected to package 550 at surfaces (contact pads) 504.

In an embodiment, interconnect members 508 are truncated. Various processes which may be used to truncate interconnect members 508 while removing a layer of encapsulating material 512, such as grinding, routing, other surface machining methods, and chemical etching processes.

Figure 6A:
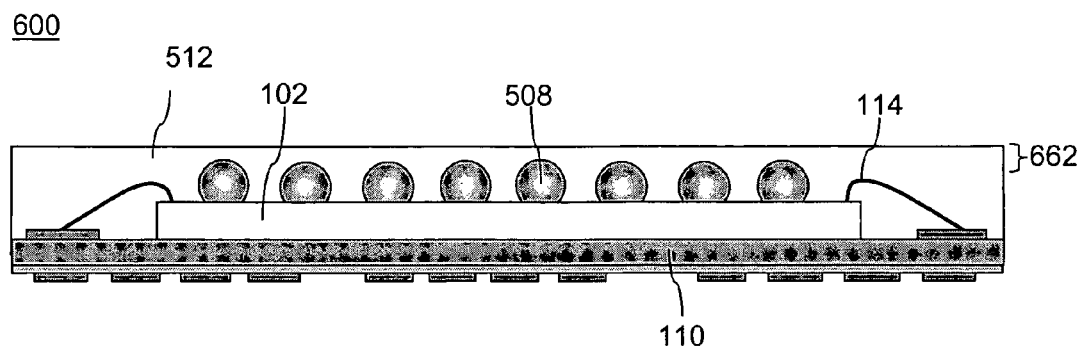
FIGS. 6A-6D illustrate cross-sectional views of example FBGA IC packages having interconnect members, according to exemplary embodiments of the invention.
Figure 6B:
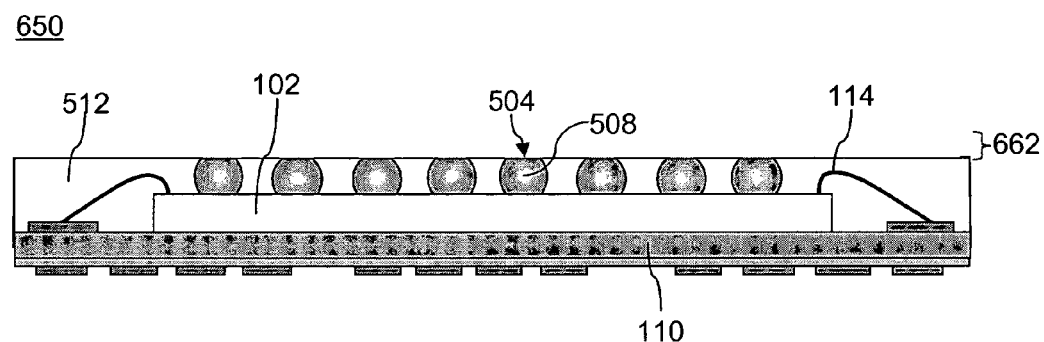
Figure 6C:
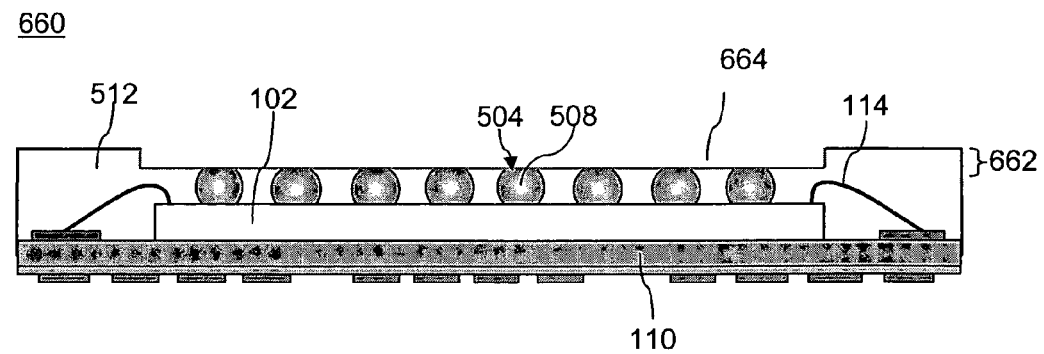

FIGS. 6A-6C illustrate example IC packages, according to embodiments of the present invention. FIG. 6A shows a package 600 in which interconnect members 508 are attached to a top surface of die 102. Encapsulating material 512 encapsulates the top surface of substrate 110, die 102, and wirebonds 114. Furthermore, interconnect members 508 are fully encapsulated by encapsulating material 512. FIG. 6B illustrates an example package 650, where a top layer of encapsulating material 512 has been removed and interconnect members 508 have been thereby truncated. Surfaces (interconnect contact pads) 504 are formed on the top surface of encapsulating material 512.

FIG. 6C shows a package 660 in which only a portion of a layer 662 of encapsulating material 512 is removed, forming a cavity 664 in encapsulating material 512. In package 660, cavity 664 is formed centrally in the top surface of encapsulating material 512, in a volume of encapsulating material 512 in which a top portion of interconnect members 512 were present. Interconnect members 508 are truncated (the top portion removed) due to the formation of cavity 664. The truncation of interconnect members 508 results in the presence of surfaces (interconnect contact pads) 504 on the surface of encapsulating material 512, inside cavity 664.

In further embodiments, any number of one or more cavities 664 may be formed in encapsulating material 512 over interconnect members 512 to expose surfaces 504.

Figure 6D:
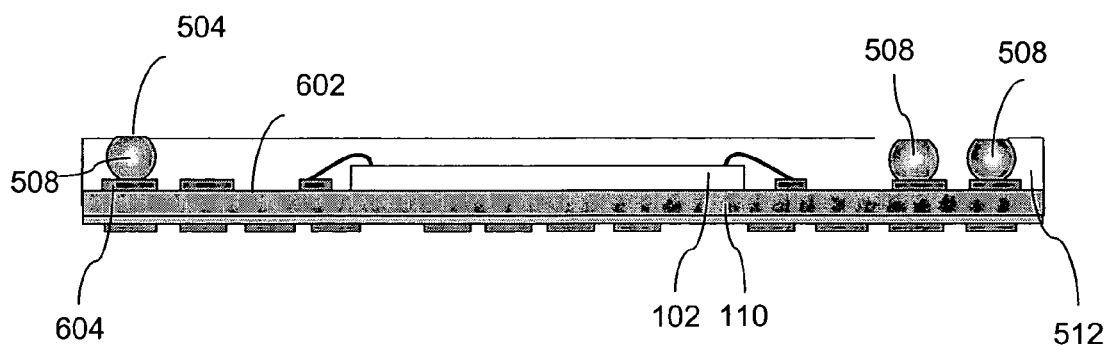

FIG. 6D shows a package 670, according to another example embodiment of the present invention. In package 670, a plurality of interconnect members 508 are mounted to electrically conductive features 604 (e.g., contact pads, bond fingers, traces, etc) on a top surface 602 of substrate 110. Interconnect members 508 are truncated (the top portion removed). The truncation of interconnect members 508 results in the presence of surfaces (interconnect contact pads) 504 on the surface of encapsulating material 512. Interconnect members 508 can be formed on top surface 602 of substrate 110 in an configuration, including a regular array, one or more rings of interconnect members 508 around die 102 on top surface 602, and any irregular configuration of interconnect members 508, where any number of interconnect members 508 are positioned as desired on top surface 602. For example, as shown in FIG. 6D, a single interconnect member 508 is shown to the left side of die 102 on top surface 602, while two interconnect members 508 are shown to the right side of die 102 on top surface 602.

Examples Embodiments of IC Package Stacking

Figure 7A:
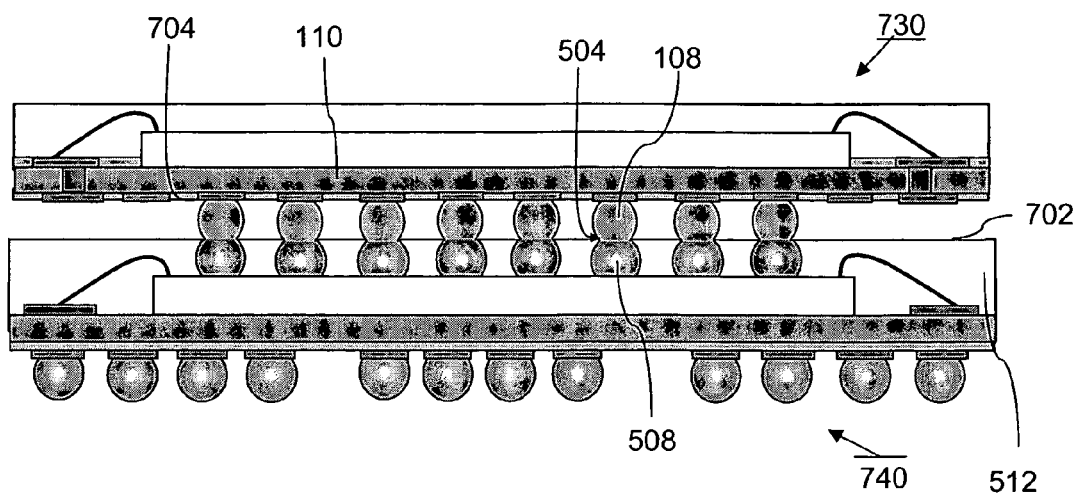
FIGS. 7A-7D illustrate cross-sectional views of example PoP stacked IC packages, according to exemplary embodiments of the invention.

FIGS. 7A-7D illustrate example embodiments of stacked FBGA packages. FIG. 7A illustrates a stacked IC package 700 that includes a second IC package 740 mounted on a first IC package 730. Second package 730 is configured similarly to package 300 shown in FIG. 3B. First package 740 is configured similarly to package 650 of FIG. 6B. Solder balls 108 on a bottom surface of substrate 110 of second package 730 are electrically coupled a plurality of interconnect members 508 accessible at a top surface 702 of encapsulating material 112 of first IC package 740. In particular, solder balls 108 are attached to surfaces 504 of interconnect members 508.

Figure 7B:
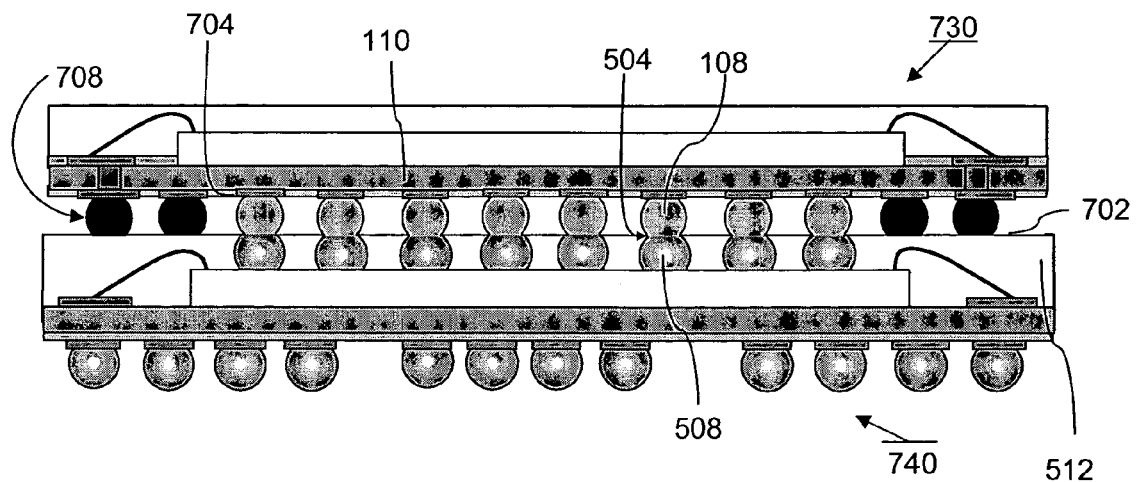
Figure 7C:
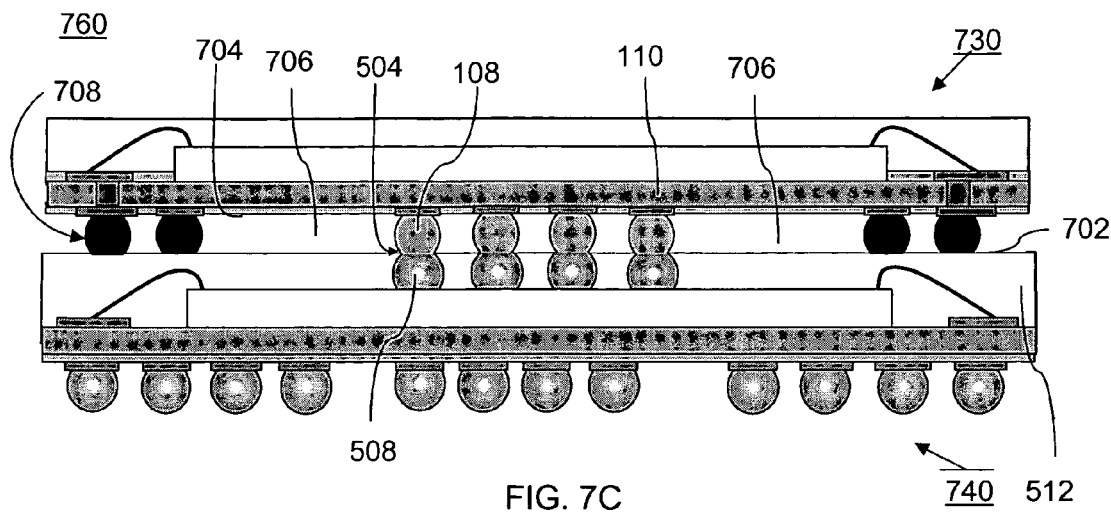

In the embodiment of FIG. 7A, each of solder balls 108 of second package 730 are coupled to a respective interconnect member 508 of first package 740. As illustrated in FIGS. 7B-7C, in embodiments, not all solder balls 108 of second package 730 are necessarily required to be electrically coupled to interconnect members 508. For example, in FIG. 7B, solder balls 708 are not electrically coupled to interconnect members 508, while solder balls 108 are coupled to interconnect members 508. In FIG. 7B, solder balls 708 are peripheral solder balls of an array of solder balls on a bottom surface 704 of second package 730. Solder balls 108 are inner solder balls of the array of solder balls on bottom surface 704 of second package 730. For example, solder balls 708 may form one or more rings of solder balls around solder balls 108. In FIG. 7C, ring shaped gap 706 that is depopulated of solder balls is present (i.e., one or more rings of solder balls are not present) between solder balls 708 and solder balls 108 on bottom surface 704 of second package 730.

In an embodiment, solder balls 708 may provide access to test signals of die 102 of second package 730 for testing of second package 730. In another embodiment, solder balls 708 may provide mechanical support for second package 730 on first package 740 at the peripheral areas of second package 730, by contacting top surface 702 of encapsulating material 512 of first package 740. In yet another embodiment, solder balls 708 serve no specific purpose or a combination of purposes.

Figure 7D:
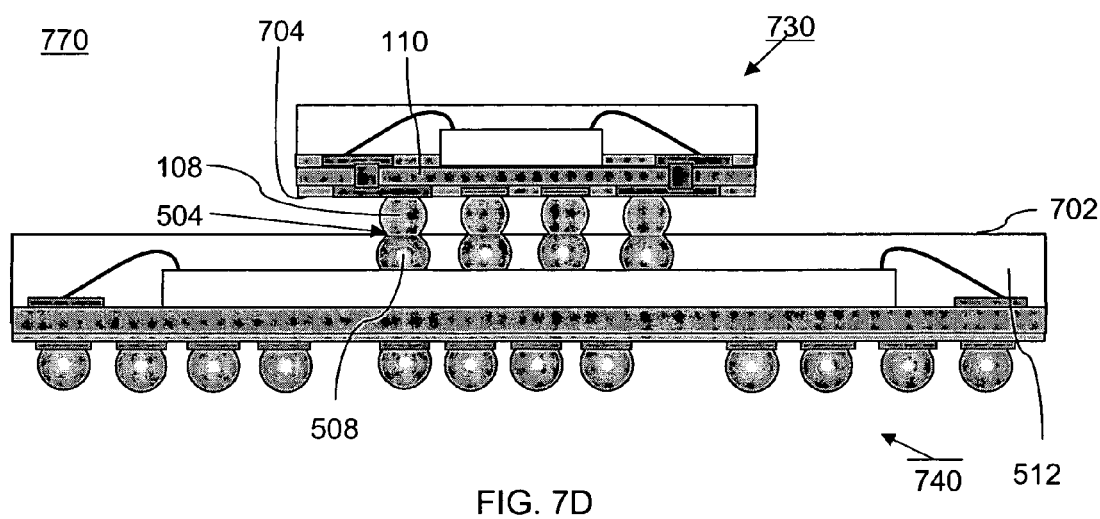

As described above, in embodiments, first and second packages 740 and 730 may be identical in size and/or configuration, or may have different sizes and/or configurations. For example, FIG. 7D illustrates an example embodiment where second package 730 is physically smaller than the first package 740 (e.g., substrate 110 of second package 730 has a lesser area than a substrate of first package 740). In an embodiment, substrate 110 of second package 730 may have a width (and/or area) substantially the same or less than a width (and/or area) of die 102 of first package 740.

Figure 8A:
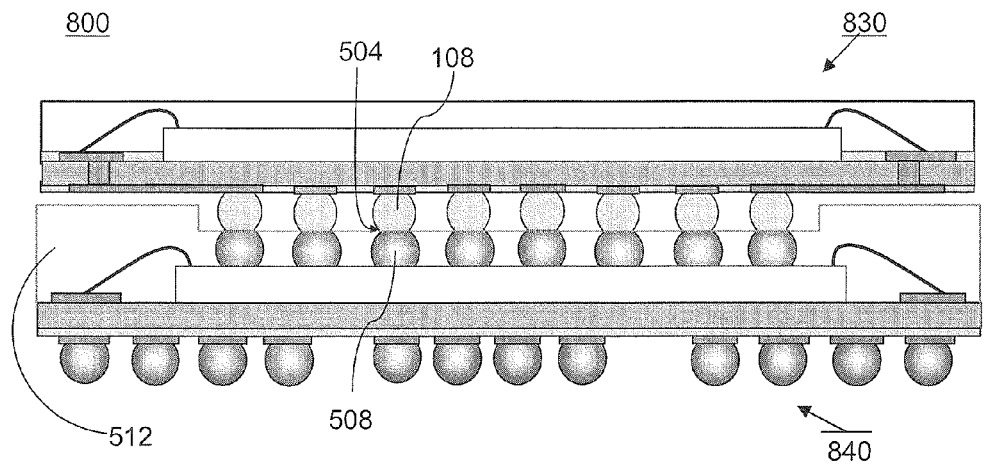
FIGS. 8A-8B illustrate cross-sectional views of example PoP stacked IC packages, according to exemplary embodiments of the invention.
Figure 8B:
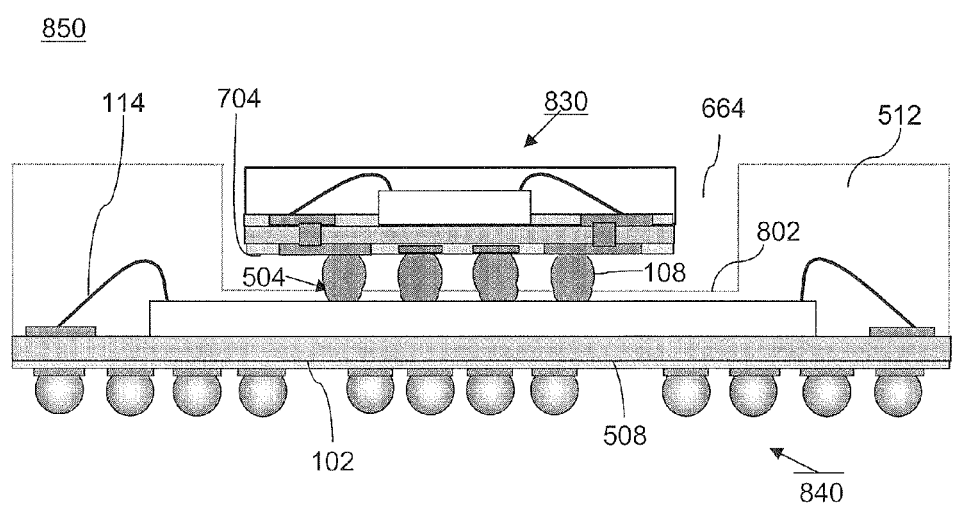

As described herein, in an embodiment, encapsulating material 512 may have a cavity 664. For example, FIGS. 8A-8B show exemplary embodiments of a stacked IC package 800 that includes a second FBGA package 830 mounted on a first FBGA package 840. In FIG. 8A, first package 840 has cavity 664 formed in encapsulating material 512. Interconnect members 508 have surfaces 504 accessible on a bottom surface 802 of cavity 664. Solder balls 108 on bottom surface 704 of second package 830 are electrically coupled to interconnect members 508 at surfaces 504.

In the embodiment of FIG. 8B, second package 830 resides entirely in cavity 664. In alternative embodiments, such as shown in FIG. 8A, only solder balls of second package 830 reside partially or entirely in cavity 664. Any portion of second package 830 may reside partially or entirely in cavity 664.

Furthermore, FIG. 8B illustrates an exemplary embodiment where die 102 of first package 840 is wider than cavity 664. Such an arrangement may enable second package 830 to be positioned very close to die 102 of first package 840, allowing for very short interconnect members 508, and therefore short signal paths, while keeping wirebonds 114 of first package 840 protected in encapsulating material 512. Another advantage is that a total height of stacked package 850 may be reduced.

Figure 9A:
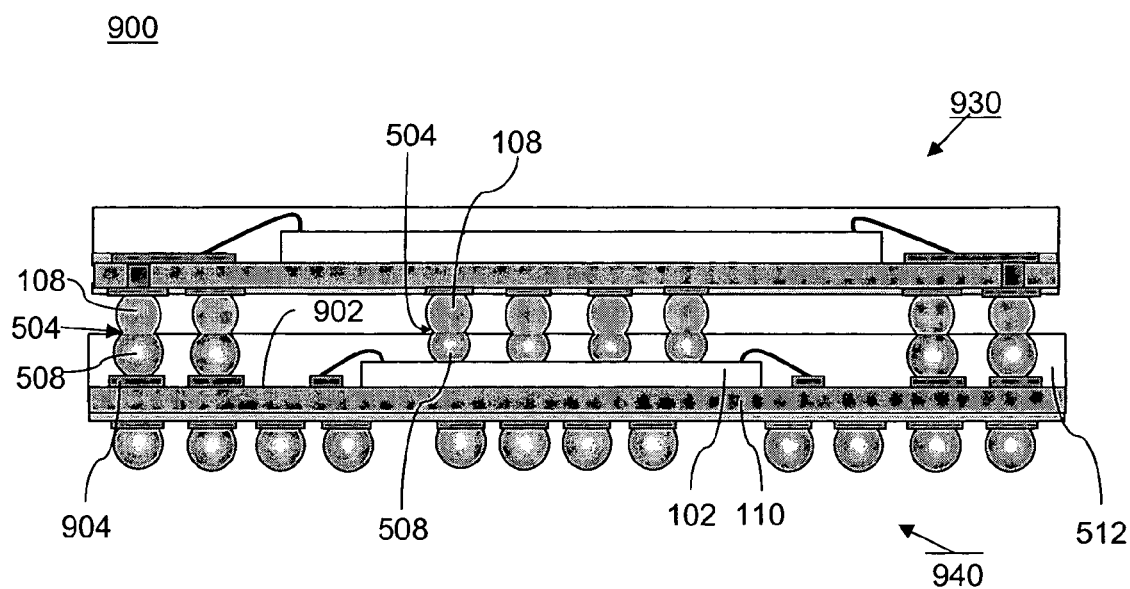
FIGS. 9A and 9B illustrates cross-sectional views of example PoP stacked IC packages, according to exemplary embodiments of the invention.

Interconnect members 508 are not limited to electrically coupling a die in a first IC package to the bottom surface of the substrate of a second IC package. For example, FIG. 9A shows a stacked IC package 900 in which a second package 930 is mounted on a first package 940. First package 940 is similar to package 670 shown in FIG. 6D. In stacked IC package 900, a first plurality of interconnect members 508 are coupled between die 102 of first package 940 and solder balls 108 of second package 930, and a second plurality of interconnect members 508 are electrically coupled between a top surface 902 of substrate 110 in first package 940 and solder balls 108 of second package 930. Thus, as shown in FIG. 9A, interconnect members 508 may be mounted to electrically conductive features 904 (e.g., contact pads, bond fingers, traces, etc) on top surface 902 of substrate 110, to be coupled to solder balls 108 of second package 930 through encapsulating material 512.

Figure 9B:
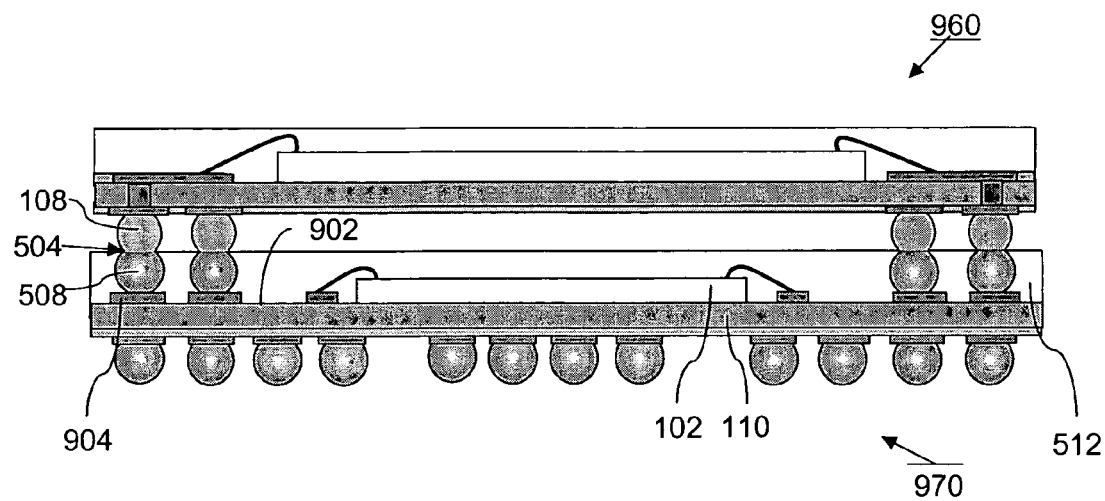

FIG. 9B shows a stacked IC package 950, according to another example embodiment of the present invention. Package 950 includes a second package 960 mounted on a first package 970. First package 970 is similar to package 940 and second package 960 is similar to package 930 shown in FIG. 9A, except that interconnect members are not present between die 102 of first package 970 and solder balls 108 of second package 960. In FIG. 9B, interconnect members 508 are mounted to electrically conductive features 904 (e.g., contact pads, bond fingers, traces, etc) on top surface 902 of substrate 110, to be coupled to solder balls 108 of second package 960 through encapsulating material 512.

The exemplary embodiments described above are not limited to FBGA or similar IC packages. Persons of ordinary skill in the relevant art(s) will understand that embodiments of the invention are applicable to many current and future IC package configurations or combinations of configurations.

Example Embodiments for Manufacturing Stacked IC Packages

FIGS. 10 and 11A-11H illustrate example embodiments related to manufacturing of stacked IC packages. Although the IC packages illustrated in FIGS. 11A-11H are BGA packages, the manufacturing embodiments described herein are applicable to other current and future. IC package configurations and technologies.

Figure 10:
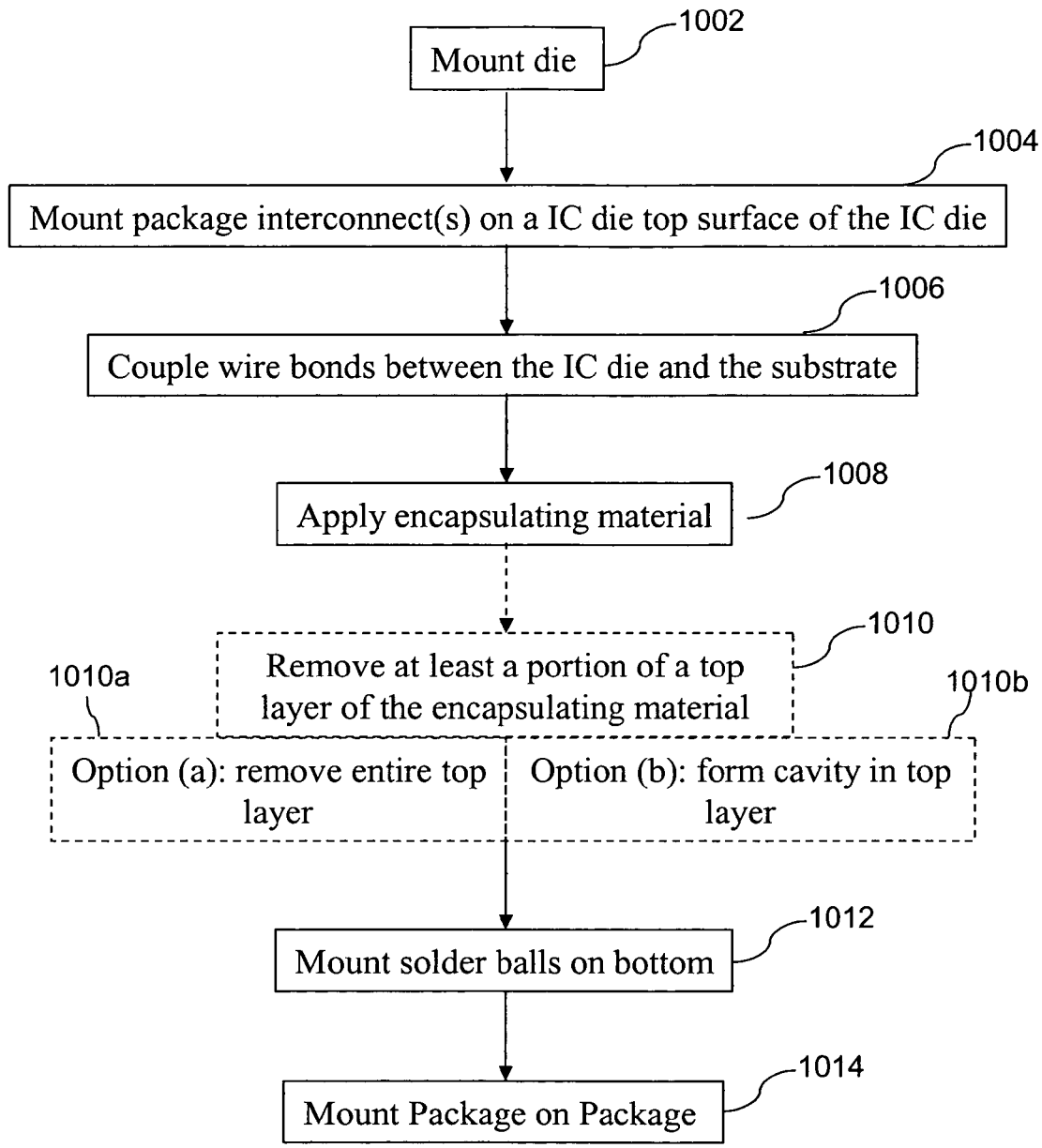
FIG. 10 illustrates an example flowchart for manufacturing IC packages, according to exemplary embodiments of the invention.

FIG. 10 shows a flowchart 1000, which illustrates an example process for manufacturing a stacked IC package. Flowchart 1000 is described with reference to FIGS. 11A-11H, which show an example FBGA package a various phases of assembly. Steps 1002-1014 of flowchart 1000 form a first IC package with a plurality of interconnect contact pads. Step 1012 stacks a second IC package on the first IC package to form a stacked IC package. Note that the steps of flowchart 1000 do not necessarily have to be performed in the order shown. Flowchart 1000 is described in detail as follows.

Figure 11A:
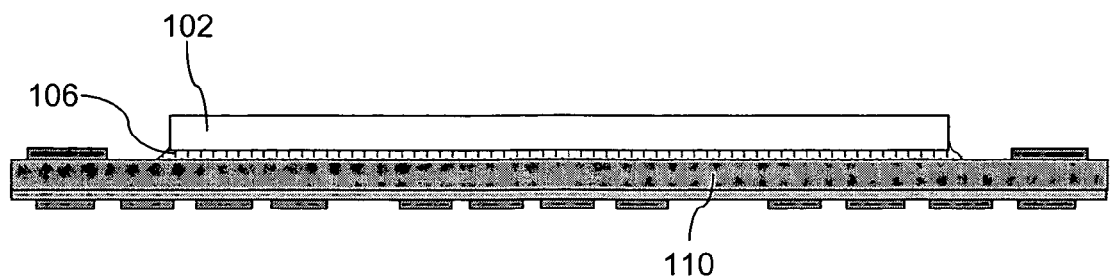
FIGS. 11A-11H illustrate cross-sectional views of example IC packages at various stages of manufacture, according to exemplary embodiments of the invention.

In step 1002, a die is mounted to a substrate. For example, the die is die 102, which is attached to substrate 110 using die attach material 106, as shown in FIG. 11A. For example, die attach material 106 may be a conventional die attach material, such as an epoxy and/or a film adhesive.

Figure 11B:
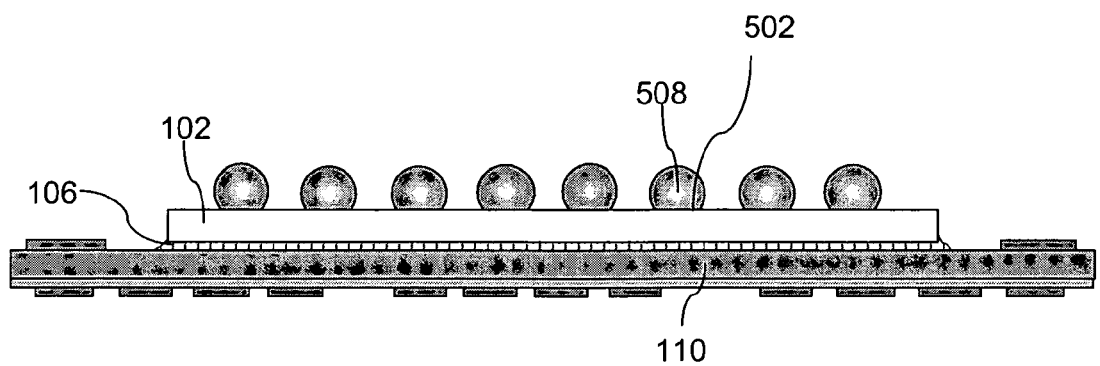

In step 1004, one or more package interconnect members are mounted on the top surface of the IC die. For example, as shown in FIG. 11B, a plurality of interconnect members 508 are mounted on die 102. In an embodiment, interconnect members 508 are mounted onto die contact pads 502 on top surface of IC die 102, as shown in FIG. 5A. In another embodiment, interconnect members 508 may also be coupled to top surface 902 of substrate 110, as shown in FIG. 9.

Figure 11C:
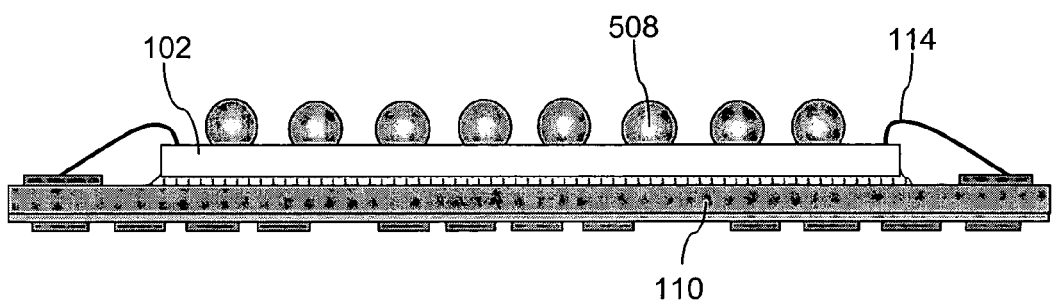

In step 1006, wire bonds are coupled between the IC die and the substrate. For example, as shown in FIG. 11C, IC die 102 is connected to substrate 110 through a wire bonding process that applies wirebonds 114.

Figure 11D:
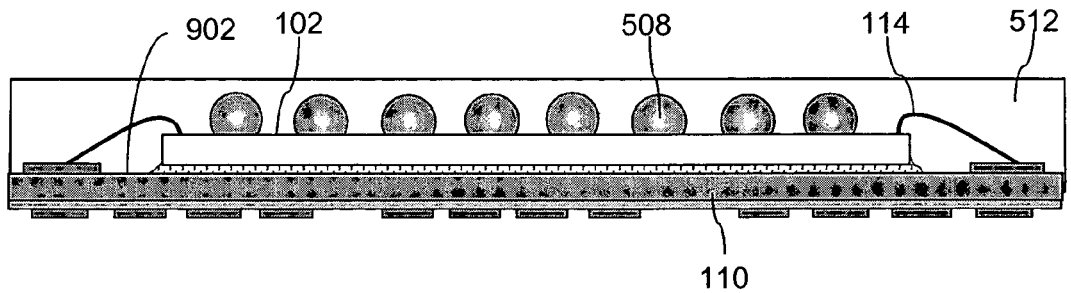

In step 1008, an encapsulating material is applied. For example, as shown in FIG. 11D, encapsulating material 512 is applied to top surface 902 of substrate 110 to encapsulate die 102, wirebonds 114, and interconnect members 508.

Figure 11E:
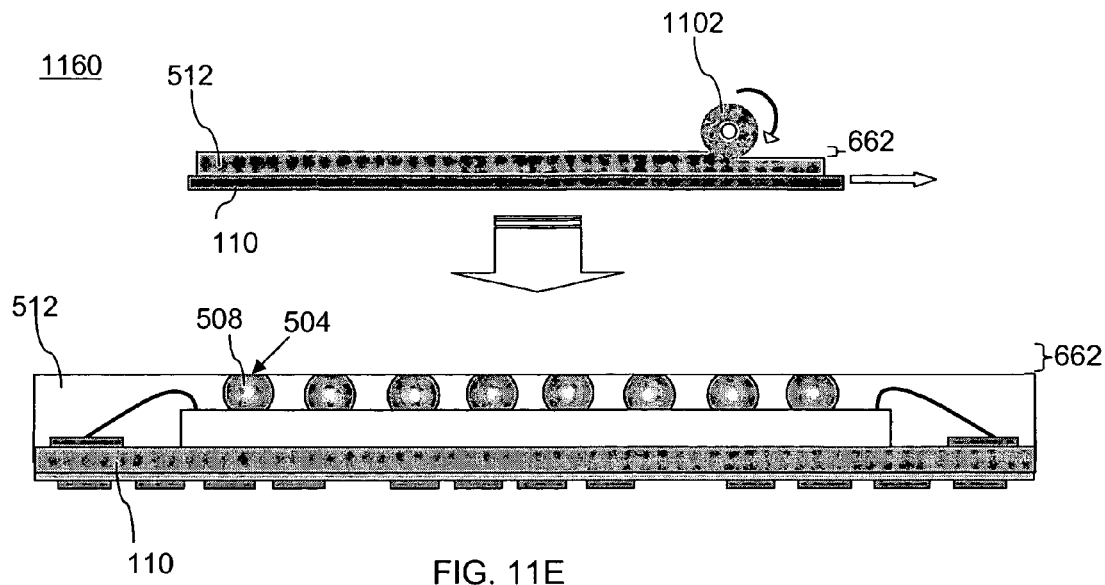
Figure 11F:
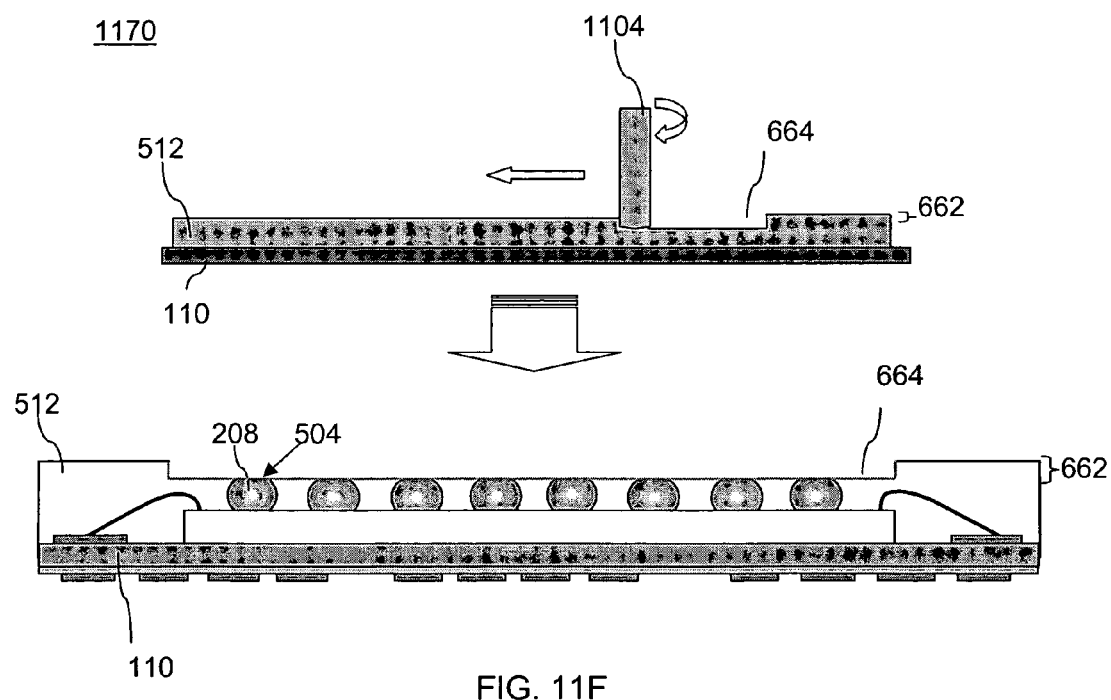

In step 1010, at least a portion of a top layer of encapsulating material 512 is removed. In an embodiment, interconnect members 508 are truncated, where a top portion of interconnect members 508 is removed along with some or all of a top layer of encapsulating material 512. Steps 1010a and 1010b illustrate two example optional ways of implementing step 1010. For example, in optional step 1010a, an entire layer of encapsulating material 512 is removed. For instance, as shown in FIG. 11E, a grinding tool 1102 grinds away a top layer of encapsulating material 512 to truncates and expose interconnect members 508. In optional step 1010b, a cavity is formed in encapsulating material 512. For example, as shown in FIG. 11F, a routing tool 1104 routes a cavity 664 into a top layer 662 of encapsulating material 512, to truncate and expose interconnect members 508. Other methods of material removal, such as chemical, mechanical, or laser machining may be used in step 1010 to remove a portion of encapsulating material 512 to expose and/or truncate interconnect members 508. Alternatively, cavity 664 can be formed in encapsulating material 512 using a mold, such as when encapsulating material 512 is applied to substrate 110.

Figure 11G:
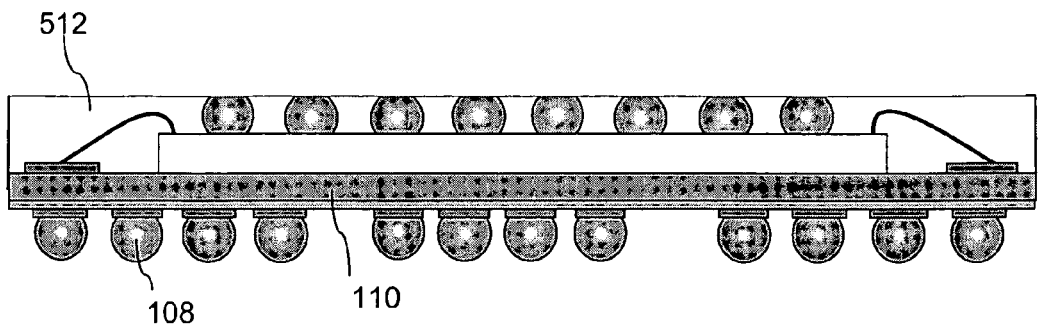

In step 1012, solder balls are mounted to the bottom surface of the substrate. For example, as shown in FIG. 11G, solder balls 108 are formed on a bottom surface 1110 of substrate 110. The solder balls may be mounted using conventional ball mount methods. FIG. 11G illustrates a first package 1180, which is the product of steps 1002-1012.

Figure 11H:
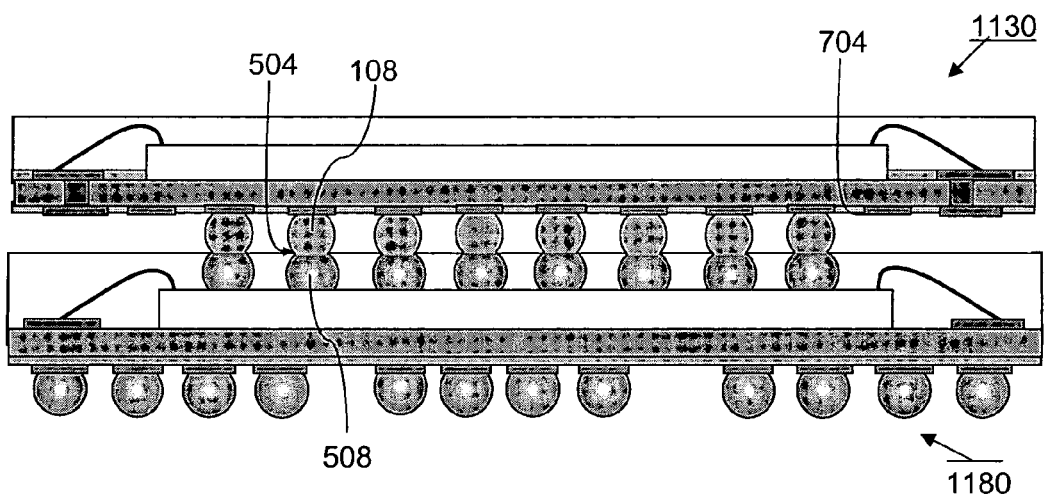

In step 1014, a second IC package is mounted on the formed first package. For example, as shown in FIG. 11H, a second IC package 1130 is mounted on first IC package 1180. Solder balls 108 on bottom surface 704 of second IC package 1130 are attached to interconnect members 508, such as by reflow soldering, an electrically conductive adhesive, and/or other way.

In a further embodiment, second IC package 1130 may have interconnect members 508 mounted thereon, and another IC package may be mounted to second IC package 1130. This process may be repeated to stack as many packages as desired.

As described above, the steps of flowchart 1000 may be performed in various orders. For example, in another exemplary embodiment, wire bonding (e.g., step 1006) may be performed before interconnect members are attached to the die (e.g., step 1004). Furthermore, for example, application of solder balls to the first package (e.g., step 1012) may be performed after the second package is mounted to the first package (e.g., step 1014). The steps of flowchart 1000 may be varied in many ways, as would be apparent to persons skilled in the relevant art(s) from the teachings herein.

For these example embodiments, solder balls were used as the package interconnect structure as an example. Other electrically conductive materials and structures can also be used to form the package-to-package interconnect contact structure on mold top by extending the electrical contact on area array package (BGA, LGA, PGA, etc.) substrate top through mold encapsulation and expose electrical contact terminals on mold top surface. For example, metal posts can be attached to the substrate top contact pads and exposed on mold top surface.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) package, comprising:
    an IC die having opposing first and second surfaces and having a plurality of contact pads located on the first surface of the IC die;
    a substrate having opposing first and second surfaces, wherein the second surface of the IC die is coupled to the first surface of the substrate;
    a plurality of interconnect members attached to the plurality of contact pads;
    a plurality of conductive elements coupled to the second surface of the substrate and coupled through the substrate to the IC die; and
    an encapsulating material that encapsulates the IC die and the plurality of interconnect members,
    wherein each interconnect member of the plurality of interconnect members is configured to physically contact a respective conductive element of a second IC package, the respective conductive element of the second IC package being attached to a substrate of the second IC package, wherein a gap is present between an outer surface of the encapsulation material and a surface of the substrate of the second IC package, and wherein the second IC package is entirely contained in a footprint of the IC die.

2. The IC package of claim 1, wherein each interconnect member of the plurality of interconnect members is a truncated solder ball.

3. The IC package of claim 1, further comprising:
    a second plurality of interconnect members;
    wherein the first surface of the substrate has a plurality of contact pads;
    wherein the second plurality of interconnect members are coupled to a corresponding contact pad of the plurality of contact pads on the first surface of the substrate; and
    wherein the second plurality of interconnect members are encapsulated by the encapsulating material such that a contact surface of each interconnect member of the second plurality of interconnect members is accessible at the surface of the encapsulating material.

4. The IC package of claim 1, wherein each interconnect member of the plurality of interconnect members comprises a metal.

5. The IC package of claim 4, wherein the metal is gold, copper, aluminum, silver, nickel, tin, or a metal alloy.

6. The IC package of claim 1, wherein each interconnect member of the plurality of interconnect members comprises a thermally conductive epoxy.

7. The IC package of claim 1, wherein each interconnect member of the plurality of interconnect members comprises a core material coated with a bonding material.

8. The IC package of claim 1, wherein each interconnect member of the plurality of interconnect members comprises a post.

9. The IC package of claim 1, wherein the plurality of conductive elements comprises a plurality of solder balls.

10. The IC package of claim 1, wherein the encapsulating material includes a first portion and a second portion, wherein the first portion and the second portion are non-planar with respect to each other, wherein the first portion exposes at least a portion of each interconnect member of the plurality of interconnect members, and wherein an exposed surface of each interconnect member of the plurality of interconnect members is substantially planar and is substantially coplanar with a surface of the first portion.

11. The IC package of claim 10, wherein the first portion comprises a cavity in which the contact surface of each of the plurality of interconnect members is accessible.

12. A stacked integrated circuit (IC) packaging device, comprising:
a first IC package, comprising:
an IC die having opposing first and second surfaces and having a plurality of contact pads located on the first surface of the IC die,
a first substrate having opposing first and second surfaces, wherein the second surface of the IC die is coupled to the first surface of the first substrate,
a plurality of interconnect members attached to the plurality of contact pads,
a first plurality of conductive elements coupled to the second surface of the first substrate and coupled through the first substrate to the IC die, and
an encapsulating material that encapsulates the IC die and the first plurality of interconnect members; and
a second IC package, comprising:
a second substrate; and
a second plurality of conductive elements attached to a surface of the second substrate, wherein each conductive element of the second plurality of conductive elements of the second IC package physically contacts a respective one of the plurality of interconnect members, wherein a gap is present between the surface of the second substrate and an outer surface of the encapsulation material, and wherein the second IC package is entirely contained in a footprint of the IC die.

13. The stacked IC packaging device of claim 12, wherein each interconnect member of the plurality of interconnect members is a truncated solder ball.

14. The stacked IC packaging device of claim 12, wherein the first IC package further comprises:
a second plurality of interconnect members;
wherein the first surface of the first substrate has a plurality of contact pads;
wherein the second plurality of interconnect members are coupled to a corresponding contact pad of the plurality of contact pads on the first surface of the first substrate;
wherein each of the second plurality of interconnect members are encapsulated by the encapsulating material such that a contact surface of each interconnect member of the second plurality of interconnect members is accessible at the surface of the encapsulating material; and
wherein the second IC package is coupled to the first IC package through the second plurality of interconnect members.

15. The stacked IC packaging device of claim 12, wherein the second IC package further comprises a plurality of solder balls attached to a bottom surface of the second IC package; and
wherein each solder ball of the plurality of solder balls is coupled to a corresponding contact surface of an interconnect member of the plurality of interconnect members.

16. The stacked IC packaging device of claim 12, wherein each interconnect member of the plurality of interconnect members comprises a metal and wherein the metal is gold, copper, aluminum, silver, nickel, tin, or a metal alloy.

17. The stacked IC packaging device of claim 12, wherein each interconnect member of the plurality of interconnect members comprises a thermally conductive epoxy.

18. The stacked IC packaging device of claim 12, wherein each interconnect member of the plurality of interconnect members comprises a core material coated with a bonding material.

19. The stacked IC packaging device of claim 12, wherein each interconnect member of the plurality of interconnect members comprises a post.

20. The IC packaging device of claim 12, wherein the first plurality of conductive elements comprises a plurality of solder balls.

21. The stacked IC packaging device of claim 12, wherein the encapsulating material includes a first portion and a second portion, wherein the first portion and the second portion are non-planar with respect to each other, wherein the first portion exposes at least a portion of each interconnect member of the plurality of interconnect members, and wherein an exposed surface of each interconnect member of the plurality of interconnect members is substantially planar and is substantially coplanar with a surface of the first portion.

22. The stacked IC packaging device of claim 21, wherein the first portion comprises a cavity in which the contact surface of each interconnect member of the plurality of interconnect members is accessible, and
wherein the second IC package is disposed at least partially in the cavity.

23. The stacked IC packaging device of claim 22, wherein the second IC package resides entirely in the cavity.

* * * * *